United States Patent
Butendeich et al.

(10) Patent No.: US 11,542,431 B2
(45) Date of Patent: Jan. 3, 2023

(54) LUMINOPHORE COMBINATION, CONVERSION ELEMENT, AND OPTOELECTRONIC DEVICE

(71) Applicant: OSRAM OLED GmbH, Regensburg (DE)

(72) Inventors: Rainer Butendeich, Sinzing (DE); Philipp Pust, Langquaid (DE); David O'Brien, Portland, OR (US); Ion Stoll, Tegernheim (DE); Marcus Adam, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 170 days.

(21) Appl. No.: 16/762,506

(22) PCT Filed: Nov. 8, 2018

(86) PCT No.: PCT/EP2018/080607
§ 371 (c)(1),
(2) Date: May 8, 2020

(87) PCT Pub. No.: WO2019/092102
PCT Pub. Date: May 16, 2019

(65) Prior Publication Data
US 2021/0238477 A1    Aug. 5, 2021

(30) Foreign Application Priority Data

Nov. 10, 2017    (WO) ................. PCT/EP2017/078913
Apr. 13, 2018    (DE) ..................... 10 2018 108 842.6

(51) Int. Cl.
C09K 11/08    (2006.01)
H05B 45/24    (2020.01)
(Continued)

(52) U.S. Cl.
CPC ........ *C09K 11/0883* (2013.01); *C09K 11/592* (2013.01); *C09K 11/7734* (2013.01);
(Continued)

(58) Field of Classification Search
CPC .............. C09K 11/0883; C09K 11/592; C09K 11/7734; C09K 11/7774; C09K 11/7706;
(Continued)

(56) References Cited

U.S. PATENT DOCUMENTS 9,028,716 B2    5/2015    Winkler et al.
9,157,025 B2   10/2015    Winkler et al.
(Continued)

FOREIGN PATENT DOCUMENTS

CN    101124295 A    2/2008
CN    102471682 A    5/2012
(Continued)

OTHER PUBLICATIONS

Pejchal et al: "Improvement of the growth of Li4SiO4 single crystals for neutron detection and their scintillation and luminescence properties", Feb. 12, 2016, pp. 143-150, Journal of Crystal Growth, vol. 457.
(Continued)

*Primary Examiner* — Su C Kim
(74) *Attorney, Agent, or Firm* — Viering, Jentschura & Partner mbB

(57) ABSTRACT

A phosphor combination may include a first phosphor and a second phosphor. The second phosphor may be a red-emitting quantum dot phosphor. The phosphor combination may optionally include a third phosphor that is a red-emitting phosphor with the formula (MB) (TA)3-2x(TC)1+2xO4-4xN4x:E. A conversion element may include the
(Continued)

phosphor combination. An optoelectronic device may include the phosphor combination and a radiation-emitting semiconductor chip.

19 Claims, 8 Drawing Sheets

(51) Int. Cl.
  *C09K 11/59* (2006.01)
  *C09K 11/77* (2006.01)
  *H01L 33/50* (2010.01)

(52) U.S. Cl.
  CPC ........ *C09K 11/7774* (2013.01); *H01L 33/502* (2013.01); *H01L 33/504* (2013.01); *H05B 45/24* (2020.01)

(58) Field of Classification Search
  CPC ..... C09K 11/08; H01L 33/502; H01L 33/504; H05B 45/24; H05B 45/37
  See application file for complete search history.

(56) References Cited

U.S. PATENT DOCUMENTS

| | | | |
|---|---|---|---|
| 10,479,936 B2 | 11/2019 | Seibald et al. | |
| 10,505,080 B2 | 12/2019 | Seibald et al. | |
| 10,644,206 B2 | 5/2020 | Seibald et al. | |
| 10,711,192 B2 | 7/2020 | Seibald et al. | |
| 2002/0190240 A1 | 12/2002 | Feldmann et al. | |
| 2006/0244358 A1 | 11/2006 | Kim et al. | |
| 2007/0166218 A1 | 7/2007 | Hirosaki et al. | |
| 2008/0012031 A1 | 1/2008 | Jang et al. | |
| 2008/0224596 A1 | 9/2008 | Park et al. | |
| 2010/0155753 A1 | 6/2010 | Imanari et al. | |
| 2010/0237767 A1* | 9/2010 | Emoto | C09K 11/7734 313/503 |
| 2010/0289044 A1 | 11/2010 | Krames et al. | |
| 2012/0019126 A1 | 1/2012 | Porob et al. | |
| 2012/0037941 A1 | 2/2012 | Schmidt et al. | |
| 2012/0146079 A1 | 6/2012 | Baumann et al. | |
| 2013/0002167 A1 | 1/2013 | Van De Ven | |
| 2013/0020533 A1 | 1/2013 | Fujinaga et al. | |
| 2013/0093362 A1 | 4/2013 | Edwards | |
| 2013/0127333 A1 | 5/2013 | Jia et al. | |
| 2013/0140981 A1 | 6/2013 | Huber et al. | |
| 2013/0257266 A1 | 10/2013 | Ishizaki | |
| 2014/0049155 A1 | 2/2014 | Kurtin | |
| 2014/0140055 A1 | 5/2014 | Chen et al. | |
| 2014/0159584 A1 | 6/2014 | Grajcar | |
| 2014/0231857 A1 | 8/2014 | Nammalwar et al. | |
| 2015/0109602 A1 | 4/2015 | Martin et al. | |
| 2015/0123155 A1 | 5/2015 | Schmidt et al. | |
| 2016/0043279 A1 | 2/2016 | Jean et al. | |
| 2016/0049560 A1* | 2/2016 | Oh | H01L 33/504 257/98 |
| 2016/0308098 A1 | 10/2016 | Bechtel et al. | |
| 2016/0312118 A1 | 10/2016 | Fiedler et al. | |
| 2017/0040501 A1 | 2/2017 | Choi et al. | |
| 2017/0077360 A1 | 3/2017 | Yang et al. | |
| 2017/0186911 A1 | 6/2017 | Otto et al. | |
| 2017/0186922 A1 | 6/2017 | Kim et al. | |
| 2017/0250317 A1* | 8/2017 | Chen | H01L 33/504 |
| 2017/0294561 A1 | 10/2017 | Ikeda et al. | |
| 2017/0371205 A1 | 12/2017 | Pellerite et al. | |
| 2018/0127648 A1 | 5/2018 | Hirosaki | |
| 2018/0148644 A1 | 5/2018 | Seibald et al. | |
| 2018/0305613 A1 | 10/2018 | Bichler et al. | |
| 2019/0085239 A1 | 3/2019 | Stenzel et al. | |
| 2019/0093011 A1 | 3/2019 | Seibald et al. | |
| 2019/0144744 A1 | 5/2019 | Seibald et al. | |
| 2019/0157520 A1 | 5/2019 | Seibald et al. | |
| 2019/0191516 A1 | 6/2019 | Li et al. | |
| 2019/0322934 A1 | 10/2019 | Seibald et al. | |
| 2019/0326481 A1 | 10/2019 | Seibald et al. | |
| 2020/0245428 A1 | 7/2020 | Baumann et al. | |
| 2021/0184082 A1 | 6/2021 | Stoll et al. | |

FOREIGN PATENT DOCUMENTS

| | | |
|---|---|---|
| CN | 103222077 A | 7/2013 |
| CN | 103827259 A | 5/2014 |
| CN | 104521016 A | 4/2015 |
| CN | 104781369 A | 7/2015 |
| CN | 105374922 A | 3/2016 |
| CN | 107111185 A | 8/2017 |
| CN | 107134521 A | 9/2017 |
| DE | 202008018060 U1 | 5/2011 |
| DE | 112011102173 T5 | 3/2013 |
| DE | 102015107580 A1 | 11/2016 |
| DE | 102017205819 A1 | 10/2017 |
| DE | 102016121692 A1 | 2/2018 |
| EP | 2104149 A1 | 9/2009 |
| EP | 2428543 B1 | 5/2013 |
| EP | 2585554 B1 | 8/2016 |
| JP | 2006232906 A | 9/2006 |
| JP | 2006237113 A | 9/2006 |
| JP | 2006313902 A | 11/2006 |
| JP | 2007146154 A | 6/2007 |
| JP | 2009179662 A | 8/2009 |
| JP | 2012524141 A | 10/2012 |
| JP | 2013539490 A | 10/2013 |
| JP | 2014031496 A | 2/2014 |
| JP | 2015526532 A | 9/2015 |
| JP | 2016042579 A | 3/2016 |
| JP | 2018517806 A | 7/2018 |
| JP | 2018530777 A | 10/2018 |
| TW | 201720908 A | 6/2017 |
| WO | 2009096082 A1 | 8/2009 |
| WO | 2012073177 A1 | 6/2012 |
| WO | 2013175336 A1 | 11/2013 |
| WO | 2016177890 A1 | 11/2016 |
| WO | 2017041875 A1 | 3/2017 |
| WO | 2018029299 A1 | 2/2018 |

OTHER PUBLICATIONS

Barth et al., "Ueber Oxide des neuen Formeltyps A[T4O4]: Zur Kenntnis von KLi3GeO4, KLi3SiO4 und KLi3TiO4"; Feb. 1984, pp. 7-22, Zeitschrift fuer anorganische und allgemeine Chemie, vol. 509, issue 2, Leipzig, Germany.

International Search Report issued for the corresponding PCT-application No. PCT/EP2018/080607, dated Feb. 14, 2019, 13 pages (for informational purpose only).

German Search Report issued for the corresponding DE-application No. 10 2018 108 842.6, dated Dec. 11, 2018, 8 pages (for informational purpose only).

Notification of Reason for Refusal issued for the Japanese patent application No. 2019507203, dated May 10, 2021, 3 pages (for informational purposes only).

Decision to Grant a Patent for corresponding Japanese Patent Application No. 2019-524388, dated Mar. 14, 2022, 2 pages (For reference purposes only).

C. Weiss et al., "Das erste Titanat mit ,,Stuffed Pyrgoms": RbNa3Li12[TiO4]4=RbNa3Li8{Li[TiO4]}4, Zeitschrift fuer anorganische und allgemeine Chemie, 1994, pp. 2064-2069 (including 1 page English translation), vol. 620, Issue 12.

German Search Report based on 10 2016 121 692.5 (8 pages) dated Jun. 19, 2017 (for reference purpose only).

International Search Report based on PCT/EP2017/070329 (3 pages) dated Nov. 10, 2017 (for reference purpose only).

J. Hofmann et al., "Neue Silicate mit ,,Stuffed Pyrgoms": CsKNaLi9{Li[SiO4]}4, CsKNa2Li8{Li[SiO4]}4, RbNa3Li8{Li[SiO4]}>4, und RbNaLi4{Li[SiO4]}4, Zeitschrift fuer anorganische und allgemeine Chemie, 1994, pp. 1495-1508 (including 1 page English translation), vol. 620, Issue 9.

K. Bernet et al., "Ein Lithosilicat" mit Kolumnareinheiten: RbLi {Li[SiO, Zeitschrift fuer anorganische und allgemeine Chemie, 1991, pp. 93-105 (including 1 page English translation), vol. 592, Issue 1.

(56) References Cited

OTHER PUBLICATIONS

Robert J. Lucas et al., "Measuring and using light in the melanopsin age", Trends in Neurosciences, Jan. 2014, 9 pages, vol. 37, No. 1, Elsevier.
B. Nowitzki et al., "Neues über Oxide vom Typ A [(TO)n] [1]: NaLi3SiO4, NaLi3GeO4 und NaLi3TiO4 [2]", Revue de Chimie minérale, 1986, pp. 217-230, Gauthier-Villars.
Philipp Pust et al., "Narrow-Band Red-Emitting Sr[LiAl3N4]:Eu2+ as a Next-Generation LED-Phosphor Material", Nature Materials, Jun. 22, 2014, 6 pages, Macmillan Publishers Limited.
Philipp Pust et al., "Ca[LiAl N :Eu2+—A Narrow-Band Red-Emitting Nitridolithoaluminate", Chemistry of Materials, May 9, 2014, 7 pages, vol. 26, American Chemical Society Publications.
R.Brandes et al., "Das erste Oxogermanat mit „Stuffed Pyrgoms: CsNa3Lis8{Li[Ge04]}4", Zeitschrift fuer anorganische und allgemeine Chemie, May 1995, pp. 713-718 (including 1 page English translation), vol. 621, Issue 5.
Philipp Pust et al., "Group (III) Nitrides M[Mg2Al2N4] (M=Ca,Sr,Ba,Eu) and Ba[Mg2Ga2N4]—Structural Relation and Nontypical Luminescence Properties of Eu2+ Doped Samples", Chemistry of Materials, 2014, pp. 6113-6119, vol. 26, American Chemical Society Publications.
Peter Wagatha et al., "Ca18.75Li10.5[Al39N55]:Eu2+—Supertetrahedron Phosphor for Solid-State Lighting", Chemistry of Materials, 2016, 28, pp. 1220-1226, vol. 26, American Chemical Society Publications.
Dominik Wilhelm et al., "Narrow-Band Red Emission in the Nitridolithoaluminate Sr4[LiAl11N14):Eu2+", Chemistry of Materials, 2017, pp. 1204-1209, vol. 29, American Chemical Society Publications.
International Search Report issued for international counterpart application PCT/EP2018/053416, dated May 2, 2018 (for reference purpose only).
German Search Report issued for German counterpart application 10 2018 205 464.9, dated Feb. 8, 2019 (for reference purpose only).
U.S. Non-Final Office Action based on U.S. Appl. No. 16/324,924 (22 pages) dated Jul. 31, 2019 (for reference purpose only).
U.S. Office Action based on U.S. Appl. No. 16/198,812, dated Aug. 6, 2019, 35 pages (for reference purpose only).
Notice of Allowance based on U.S. Appl. No. 16/302,724 (9 pages) dated Sep. 30, 2019 (for reference purpose only).
Notice of Allowance issued for corresponding U.S. Appl. No. 16/202,188 dated Mar. 6, 2020, 10 pages (for informational purpose only).
Notification of Reason for Refusal issued for the Japanese patent application No. 2019507204, dated May 10, 2021, 3 pages (for informational purposes only).
U.S. Non-Final Office Action based on U.S. Appl. No. 16/637,282, dated Nov. 11, 2020, 10 pages (for informational purposes only).
U.S. Non-Final Office Action based on U.S. Appl. No. 16/926,821, dated Jun. 24, 2021, 6 pages (for informational purposes only).
Office Action for U.S. Appl. No. 16/202,182, dated Oct. 5, 2021, 20 pages (for reference purposes only).
Freia Ruegenberg et al., "A Double-Band Emitter with Ultranarrow-Band Blue and Narrow-Band Green Luminescence", Chemistry A European Journal, 2020, pp. 2204-2210, Wiley-VCH Verlag GmbH & Co. KGaA.
Search report for German patent application No. 10 2020 204 429.5, dated Jan. 8, 2021, 5 pages (for reference purposes only).
Search Report for international application No. PCT/EP2021/058221, dated Jun. 21, 2021, 4 pages (for reference purposes only).
Lili Wang et al., "Narrow-band green emission of Eu2+ in a rigid tunnel structure: site occupations, barycenter energy calculations and luminescence properties", Inorganic Chemistry Frontiers, 2019, pp. 3604-3612, vol. 6.
Ming Zhao et al., "Discovery of New Narrow-Band Phosphors with the UCr4C4-Related Type Structure by Alkali Cation Effect", Advanced Optical Materials, 2019, 9 pages, vol. 7, Wiley-Vch Verlag GmbH & Co. KGaA.
Office Action for U.S. Appl. No. 16/302,748, dated Oct. 4, 2021, 11 pages (for reference purposes only).
Daniel Dutzler et al., "Alkali Lithosilicates: Renaissance of a Reputable Substance Class with Surprising Luminescence Properties", Angewandte Chemie International Edition, Aug. 13, 2018, pp. 13676-13680, vol. 57, Wiley-Vch Verlag GmbH & Co. KGaA.
German Search Report based on 10 2016 121 694.1 (9 pages) dated Jul. 7, 2017 (for reference purpose only).
Hongxu Liao et al., "Learning from a Mineral Structure toward an Ultra-Narrow-Band Blue-Emitting Silicate Phosphor RbNa 3 (Li 3 SiO 4 ) 4 :Eu 2+", Angewandte Chemie International Edition, Aug. 3, 2018, 5 pages, vol. 57, Wiley-Vch Verlag GmbH & Co. KGaA.
International Search Report based on PCT/EP2017/070343 (3 pages) dated Nov. 10, 2017 (for reference purpose only).
Ming Zhao et al., "Emerging ultra-narrow-band cyan-emitting phosphor for white LEDs with enhanced color rendition", Light: Science & Applications, Apr. 10, 2019, 9 pages, vol. 8.
Ming Zhao et al., "Next-Generation Narrow-Band Green-Emitting RbLi(Li 3 SiO 4 ) 2 :Eu 2+ Phosphor for Backlight Display Application", Advanced Materials, Aug. 8, 2018, 8 pages, vol. 30, Wiley-Vch Verlag GmbH & Co. KGaA.
Wei Wang et al., "Photoluminescence Control of UCr4C4-Typed Phosphors with Superior Luminous Efficiency and High Color Purity via Controlling Site-Selection of Eu2+ Activators", Chemistry of Materials, 2019, pp. 9200-9210, vol. 31, American Chemical Society Publications.
Ma, Y.Y. et al., "Electronic and Luminescence Properties of LiSION: Eu2+, Eu2+/Mn2+ as a Potential Phosphor for JV-Based White LEDs", IOP Science, published on Jul. 17, 2012, pp. R1-R6, ECS Journal of Solid State Science and Technology, vol. 1, Issue 1.
Second Office Action issued for the corresponding Chinese patent application No. 201780049590.9, dated Jun. 15, 2022, 5 pages (for informational purposes only).
Search Report by Registered Search Organization issued for the corresponding Japanese patent application No. 2020-525923, dated Jul. 12, 2022, 10 pages (for informational purposes only).
First Search Report issued for the corresponding Chinese patent application No. 2018800728674, dated Jul. 26, 2022, 2 pages (for informational purposes only).
Written Opinion and International Search Report (based on PCT/EP2017/070343) dated Nov. 10, 2017 including English translation of Written Opinion and ISR (22 pages).
X.M. Zhang et al., "Photoluminescence properties of blue-emitting Li4SrCa(SiO4)2:Eu2+ phosphor for solid-state lighting", Applied Physics B Lasers and Optics, published on Nov. 21, 2009, pp. 279-284, vol. 99.

\* cited by examiner

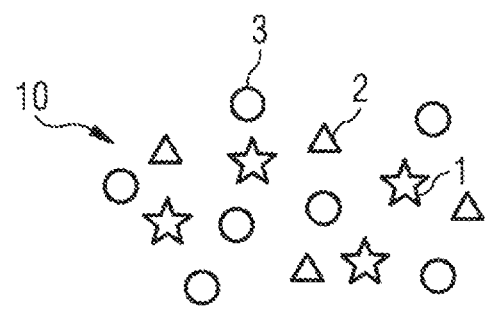
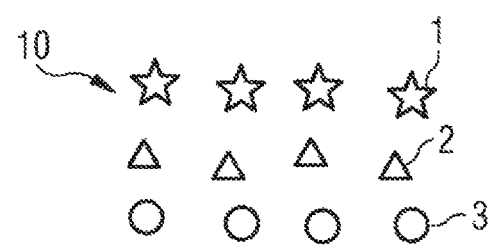
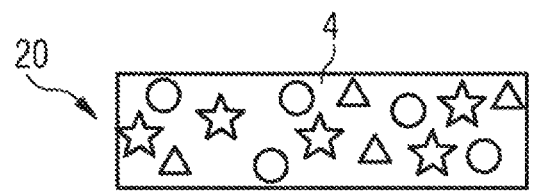

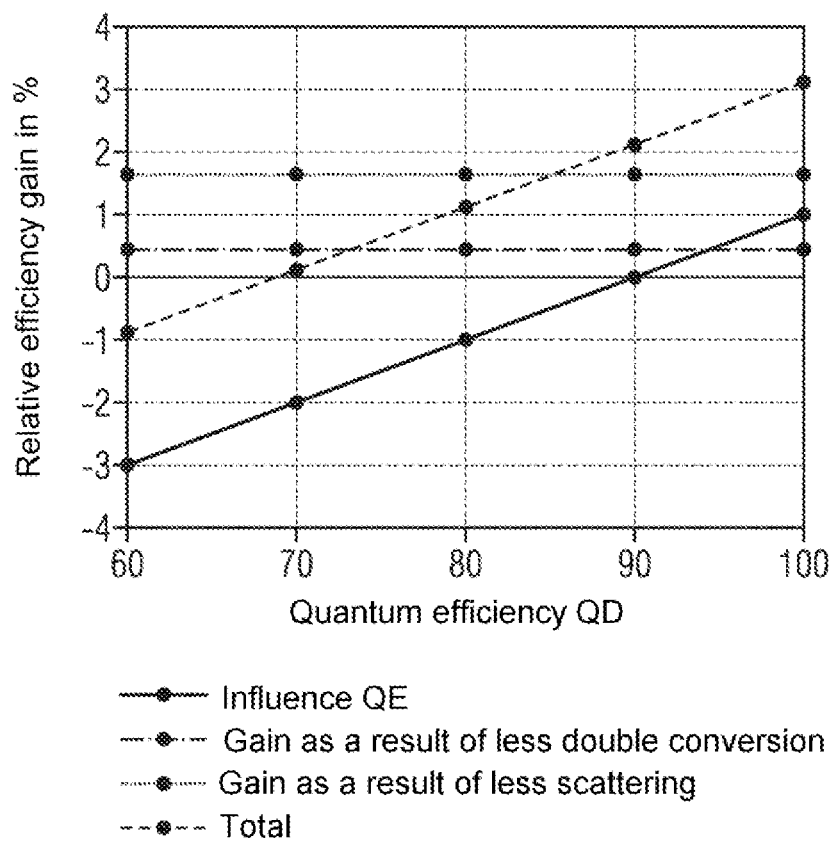

| Phosphors | Emission | Reference LED | LED according to the invention |
|---|---|---|---|
| Garnet | green | 48% by weight | 31 by weight |
| Nitride | short-wave red | 1 % by weight | 1 % by weight |
| Nitride | long-wave red | 4 % by weight | 2 % by weight |
| Quantum dot phosphor | red | - | 1 % by weight |

FIG 11

| Phosphor combination | Example 1<br>LuAGaG:Ce$^{3+}$,<br>CdS/CdSe-<br>quantum dot | Example 2<br>LuAGaG:Ce$^{3+}$,<br>Sr[Al$_2$Li$_2$O$_2$N$_2$]:Eu$^{2+}$,<br>CdS/CdSe-<br>quantum dot | Example 3<br>LuAGaG:Ce$^{3+}$,<br>Sr(Sr,Ca)Si$_2$Al$_2$N$_6$:Eu$^{2+}$,<br>CdS/CdSe-<br>quantum dot | Comparative example 1<br>LuAGaG:Ce$^{3+}$,<br>Sr[Al$_2$Li$_2$O$_2$N$_2$]:Eu$^{2+}$ | Comparative example 2<br>LuAGaG:Ce$^{3+}$,<br>Sr(Sr,Ca)Si$_2$Al$_2$N$_6$:Eu$^{2+}$ |
|---|---|---|---|---|---|
| Cx | 0.4341 | 0.4338 | 0.4341 | 0.4346 | 0.4342 |
| Cy | 0.4038 | 0.4032 | 0.4045 | 0.4037 | 0.4037 |
| CCT | 3000 K | 3000 K | 3000 K | 3000 K | 3000 K |
| CRI | 91 | 93 | 94 | 94 | 94 |
| R9 | 96 | 89 | 83 | 75 | 74 |
| LER | 335 | 323 | 313 | 312 | 301 |

US 11,542,431 B2

LUMINOPHORE COMBINATION, CONVERSION ELEMENT, AND OPTOELECTRONIC DEVICE

CROSS-REFERENCE TO RELATED APPLICATIONS

The present application is a national stage entry according to 35 U.S.C. § 371 of PCT application No.: PCT/EP2018/080607 filed on Nov. 8, 2018; which claims priority to PCT Patent Application Serial No.: PCT/EP2017/078913 filed on Nov. 10, 2017, as well as German Patent Application Serial No.: 10 2018 108 842.6 filed on Apr. 13, 2018; all of which are incorporated herein by reference in their entirety and for all purposes.

TECHNICAL FIELD

A phosphor combination, a conversion element and an optoelectronic device are disclosed.

BACKGROUND

The prior art discloses various ways of using optoelectronic devices, such as light-emitting diodes, for instance, to generate light containing proportions of different wavelength ranges of the visible spectrum. One important application is the generation of white light.

The use of two or more semiconductor chips which emit light of different wavelengths constitutes one way of using an optoelectronic device to generate light which covers different wavelength ranges of the visible spectrum. By way of example, an optoelectronic device can contain a blue-emitting semiconductor chip and a red-emitting semiconductor chip. If white light is intended to be generated, the blue semiconductor chip can additionally be combined with one or more phosphors which convert the blue radiation into radiation of the visible spectrum having a longer wavelength, for example to green light. However, the emitted radiation from known red-emitting semiconductor chips changes with regard to its dominant wavelength and intensity depending on the temperature and the applied current. The use of red-emitting semiconductor chips in addition to blue-emitting semiconductor chips thus necessitates additional driving within the optoelectronic device.

As an alternative thereto, it is also possible to generate light that covers different wavelength ranges of the visible spectrum by combining a single, e.g. blue-emitting, semiconductor chip with one or more phosphors, wherein the phosphors convert the radiation emitted by the semiconductor chip into radiation of the visible spectrum having a longer wavelength. Phosphor combinations (or phosphor mixtures) composed of conventional phosphors are usually used for this purpose. By way of example, white light can be generated by blue light emitted by a semiconductor chip being partly converted into green, yellow and red light with the aid of a phosphor mixture. White light can be obtained overall by means of the superimposition of light of different wavelengths.

The efficiency and also the color quality are of crucial importance for optoelectronic devices which generate light that covers proportions with different wavelength ranges in the visible spectrum, such as in the case of white light, for instance.

Both the efficiency and the color quality (or color rendering) are determined to a considerable extent by the phosphor mixture which converts the radiation emitted by the semiconductor chip.

SUMMARY

It is therefore an object to specify a combination of phosphors—viz. a phosphor combination—which is suitable in particular for enabling a high efficiency in conjunction with a good color rendering in the case of use in an optoelectronic device. Furthermore, an intention is to specify a conversion element which is likewise suitable in particular for enabling a high efficiency with a good color rendering in the case of use in an optoelectronic device. Finally, an intention is to specify an optoelectronic device containing the phosphor combination.

These objects are achieved by means of a phosphor combination having the features of patent claim 1, by means of a conversion element having the features of patent claim 17, and by means of an optoelectronic device having the features of patent claim 18.

In accordance with a first aspect, a phosphor combination is specified which comprises at least one first phosphor and at least one second phosphor, wherein the second phosphor is a red-emitting quantum dot phosphor.

In this case, a phosphor combination should be understood to mean a combination of different phosphors. In a non-limiting embodiment, the phosphor combination is a phosphor mixture, that is to say a mixture of the first and second phosphors and optionally of a third phosphor or optionally of even further phosphors with one another. By way of example, the phosphors can be present in particle form. By way of example, besides the phosphors, the phosphor combination can also contain other materials, for instance a matrix material, into which the phosphors are embedded or in which the phosphors are distributed.

The first phosphor should be understood to mean, in particular, a phosphor which is suitable for converting e.g. UV radiation and/or blue light into radiation of the visible spectrum having a longer wavelength. That is to say that the first phosphor absorbs e.g. UV radiation or blue light and emits radiation of the visible spectrum having a longer wavelength; e.g. the first phosphor emits green light. The first phosphor can absorb wavelengths having a shorter wavelength than the inherent emission of the first phosphor. The first phosphor can for example have a very wide absorption spectrum, and also absorb cyan- and green-colored light besides UV radiation and/or blue light and finally emit green light.

Here and hereinafter blue light is understood to mean light having a wavelength of 420 to 490 nm, such as light having a wavelength of 430 to 470 nm.

Here and hereinafter green light is understood to mean light having a wavelength of 490 to 570 nm.

Here and hereinafter a quantum dot phosphor is understood to mean semiconducting particles (so-called "quantum dots", QD for short) having a mean diameter in the nanometers range, i.e. a mean diameter ($d_{50}$) of greater than or equal to 1 nm and less than 1 μm. Quantum dots can agglomerate in part to form agglomerates. Here and hereinafter, however, in each case the individual quantum dot is crucial for determining the mean diameter.

The quantum dot phosphor of the phosphor combination is a red-emitting quantum dot phosphor. That is to say that the quantum dot phosphor is suitable in particular for converting UV radiation or blue light into light in the red wavelength range, in other words it absorbs UV radiation or blue light and emits red light.

The phosphor combination is distinguished by an improved efficiency and at the same time a color quality.

Conventional phosphor combinations—which serve for generating light having proportions with different wavelength ranges in the visible spectrum, such as in particular white light—are subject to a large number of limitations with regard to their color rendering and efficiency.

For improving the color rendering and efficiency of a phosphor combination when the latter is used in an optoelectronic device, primarily the red-emitting phosphors play an important part since the sensitivity of the eye, which decreases in the red spectral range, significantly limits the spectral efficiency (LER). At the same time a well-defined red proportion is required for the color quality, in particular of white light.

LER is an abbreviation of the English expression "luminous efficacy of radiation" and is also referred to as the photometric radiation equivalent of a light source. This involves the quotient of luminous flux ($\phi_v$ in lm) and radiation power ($\phi_v$ in mW). For determining the LER, a spectrum is weighted according to the sensitivity of the human eye. It ultimately indicates how "efficiency-favorably" a spectrum is shaped.

The inventors have recognized that a desired well-defined red proportion can be achieved particularly well by the use of red-emitting quantum dot phosphors, which has a positive effect on the color quality. Quantum dot phosphors have particular absorption and emission properties on account of their size in the nanometers range. They have a particularly narrowband emission spectrum. By contrast, conventional phosphors usually have wide emission bandwidths having a full width at half maximum (FWHM) of 60 to 120 nm. Relative thereto quantum dot phosphors have narrower emission bandwidths, which generally in relation to the full width at half maximum (FWHM) are less than 60 nm, often less than 50 nm or even 40 nm, e.g. between 20 nm and 40 nm.

Here and hereafter the full width at half maximum is understood to mean the spectral width at half the level of the maximum of the emission peak, FWHM for short. The emission peak is understood to mean the peak having the maximum intensity.

The well-defined narrowband emission not only results in a good color quality, but also affords a spectral efficiency advantage (spectral efficiency, LER for short) as a result of less weakly eye-weighted deep-red proportions.

The inventors have additionally ascertained that the use of quantum dot phosphors in a phosphor combination makes it possible to increase the total efficiency of an optoelectronic device comprising the phosphor combination. The total efficiency or luminous efficiency (having the unit LPW=abbreviation of "lumens per watt") results from the quotient of luminous flux ($\phi_v$ in lm) and absorbed electrical power (P in W). The efficiency of conventional optoelectronic devices (e.g. LEDs that emit white light), comprising conventional phosphor combinations, is reduced by a number of loss paths.

Besides the spectral efficiency (LER) already mentioned, the efficiency of the conversion processes of the respective phosphors is significant for the efficiency of optoelectronic devices. The phosphors act as converters since they convert light of shorter wavelength, e.g. blue light, that is emitted by a semiconductor chip into light of longer wavelength. Losses occur, for instance, if the quantum efficiency (QE) of the respective phosphor has values of less than 100%. A typical phosphor has a quantum efficiency of approximately 90%, i.e. out of 100 absorbed photons 90 converted photons are emitted.

A further loss path is caused by scattering experienced by photons in a conventional optoelectronic device as a result of phosphor particles. On account of the size of the particles of conventional phosphors, which is usually in the range of a few μm, and also on account of the difference in refractive index of the phosphor particles in comparison with the matrix material, which usually surrounds the particles, scattering takes placed. Scattered light is then often absorbed at surfaces that are not ideally reflective within the optoelectronic device.

The inventors have recognized that not only the emission behavior but also the absorption behavior of conventional red-emitting phosphors play an important part for some of the loss paths mentioned. Conventional phosphor mixtures comprising conventional red phosphors have a wide absorption ranging from the short-wave, blue range of the spectrum through to the range of the inherent emission of the phosphor in the red spectral range (cf. FIG. 5A). Consequently, conventional red phosphors not only absorb blue light, such as is emitted by a semiconductor chip, but also in part emit photons from the green spectral range, for instance, and convert these, too, into red light. This results directly in two loss processes:

Firstly, as a result a certain proportion of red photons is generated by way of a two-stage conversion process; i.e. a first conversion step from blue to green and a second conversion step from green to red take place. Red light that arises in this way experiences a double loss in relation to the quantum efficiency. Instead of 90% the quantum efficiency of such a two-stage process is only 90%*90%=81% (cf. FIG. 6A).

Secondly, in a conventional phosphor combination of this type, a part of the green phosphor always assumes the role of a "sacrificial phosphor". This means that a part of the green phosphor does not emit green light at all, but rather red light. This part of the phosphor thus contributes no green photons to the spectrum, but rather is used only for generating red photons. However, this amount of sacrificial phosphor, which is actually unnecessary spectrally for an optimum color rendering, contributes to scattering losses. In conventional phosphor combinations, these losses are reduced in part by the use of larger phosphor particles, but this is technologically limited and therefore possibly only within certain limits.

Conventional phosphor combinations which do not comprise a red-emitting quantum dot phosphor, but instead have exclusively conventional red-emitting phosphors, are thus afflicted to a particular degree by losses attributable in each case to the undesired absorption of the conventional red phosphors primarily in the green spectral range. In the case of conventional phosphor combinations of this type, attempts are occasionally made to reduce the undesired double conversion mentioned by spatially separating the different phosphors of the phosphor combination from one another, such that a double conversion is no longer possible as a result of this separation when the phosphor combination is used in an optoelectronic device. However, this requires additional complex steps during the production of corresponding phosphor combinations and/or optoelectronic devices. Moreover, this separation often results in difficulties with regard to color locus control and ensuring an isotropic spectrum.

The inventors have recognized that phosphor combinations in which conventional red-emitting phosphors are replaced partly or completely by a red-emitting quantum dot phosphor make it possible to reduce the loss paths mentioned above and thus to improve the efficiency.

In this application, the term conventional phosphor denotes a phosphor which is neither a quantum dot phosphor nor a phosphor which exhibits the features of the third phosphor described further below.

Quantum dot phosphors have an absorption behavior that differs from that of conventional phosphors. Whereas typical, conventional red-emitting phosphors exhibit absorption in a very wide range of the spectrum, quantum dot phosphors absorb almost exclusively in the short-wave, in particular in the blue, range of the spectrum (FIG. 5B). This is particularly greatly pronounced for quantum dot phosphors having a core-shell structure. The latter absorb almost exclusively in the range of the emission from blue semiconductor chips. Quantum dot phosphors generally exhibit significantly less absorption in the longer-wave range than conventional phosphors. Red-emitting quantum dot phosphors do not absorb in particular in the range of their inherent red emission. That means that, in the case of a phosphor combination comprising a first, conventional phosphor and a red-emitting quantum dot phosphor, the red proportion in the spectrum, which is generated by the quantum dot phosphor, predominantly arises directly as a result of the conversion from blue to red light. By contrast, an undesired two-stage conversion process is largely avoided. Moreover, in this case, no appreciable proportions of the first phosphor are manifested as sacrificial phosphor. In this regard, scattering losses attributed to the sacrificial phosphor can also be avoided. An additional factor, moreover, is that on account of their small size in the nanometers range, quantum dot phosphors themselves do not cause appreciable scattering, with the result that a direct reduction of scattering losses on account of the small scattering by quantum dot phosphors is also added to the already mentioned indirect reduction of the scattering losses on account of avoiding the unnecessary sacrificial phosphor.

Since the loss paths mentioned can be significantly reduced by the use of red-emitting quantum dot phosphors, a phosphor combination enables higher conversion efficiencies. The use of red-emitting quantum dot phosphors thus affords advantages with regard to both spectral efficiency and conversion efficiency, such that the use of corresponding phosphor combinations in optoelectronic devices overall results in an improved total electrical efficiency.

The inventors have ascertained that, in the case of phosphor combinations, both contributions concerning spectral efficiency and conversion efficiency, contrary to the original expectation, are positive and thus surprisingly allow an increase in the total efficiency. The advantage as a result of less scattering can be so great that a net gain for the conversion efficiency is achieved even if the quantum efficiency of the relevant quantum dot phosphor is less than that of a conventional red-emitting phosphor that is replaced. This has been confirmed computationally and experimentally by the inventors (FIGS. 7 and 8).

Non-limiting developments of the phosphor combinations are specified below.

In accordance with at least one embodiment, the quantum dot phosphor absorbs blue light and emits red light. In a non-limiting embodiment, the quantum dot phosphor absorbs blue light having a peak wavelength of between 420 and 490 nm, such as between 430 and 470 nm. In a non-limiting embodiment, the quantum dot phosphor emits light having a peak wavelength in the range of 590 to 650 nm, such as in a range of 600 nm to 640 nm, for example 610 nm to 650 nm, or 620 nm to 640 nm, In the present case, "peak wavelength" can denote that wavelength in the emission spectrum at which the maximum intensity in the emission spectrum lies.

In accordance with at least one embodiment, the quantum dot phosphor emits red light, wherein the emission bandwidth for a full width at half maximum (FWHM) is between 10 nm and 60 nm, in particular between 15 and 50 nm, such as between 20 and 40 nm.

In accordance with at least one embodiment, the phosphor combination is a phosphor mixture.

In accordance with at least one embodiment, the phosphor combination is a phosphor mixture which furthermore comprises a matrix material, into which the first phosphor and the red-emitting quantum dot phosphor and optionally a third and/or further phosphors are embedded. The phosphors can be distributed in the matrix material uniformly, in particular. In particular, the matrix material is a transparent matrix material, for example a matrix material comprising or consisting of a resin, a silicone, glass or a hybrid material or combinations thereof.

In accordance with at least one embodiment, the phosphor combination furthermore comprises a third phosphor. In a non-limiting embodiment, the third phosphor is a red-emitting phosphor.

By way of example, the third phosphor can likewise be a quantum dot phosphor. By means of a further quantum dot phosphor, further ranges of the visible spectrum can be covered in a targeted manner by means of a well-defined narrowband emission and at the same time efficiency losses can be avoided. By way of example, the third phosphor can likewise be a red-emitting quantum dot phosphor. In this case, it is possible to choose the second phosphor to be a quantum dot phosphor which emits in the short-wave red range, and to choose the third phosphor to be a quantum dot phosphor which emits in the long-wave red range. Thus, the third phosphor then emits in a longer-wave range of the visible spectrum than the second phosphor. A phosphor combination of this type is distinguished by a high efficiency and good color rendering.

In a non-limiting embodiment, the third phosphor is a red-emitting phosphor that is free of mercury (Hg) and/or cadmium (Cd). A number of commercially available quantum dot phosphors comprise heavy metals, such as Hg or Cd, the concentration of which is limited in commercial electrical and electronic devices under the regulations of the RoHS ("reduction of hazardous substances", EU Directive 2011/65/EU). By choosing the third phosphor to be a red-emitting phosphor that is free of Hg and Cd, it is possible for the proportion of a second phosphor optionally comprising Hg and/or Cd, said second phosphor being a quantum dot phosphor, to be limited quantitatively such that the stipulations of EU Directive 2011/65/EU can be complied with. Phosphor combinations of this type satisfy high requirements in respect of the color quality. At the same time they have a high efficiency and fulfil the regulations of the RoHS.

In accordance with at least one embodiment, the first phosphor is a green-emitting phosphor. In a non-limiting embodiment, the first phosphor absorbs blue light, for example light having a peak wavelength of between 430 and 470 nm, and emits green light, in particular green light having a peak wavelength of between 490 and 570 nm.

In accordance with at least one embodiment, the first phosphor is a conventional phosphor. This is taken to mean, in particular, that the first phosphor is not a quantum dot phosphor. Thus, the phosphor mixture then comprises at least one red-emitting quantum dot phosphor as second phosphor and a non-quantum dot phosphor as first phosphor.

The inventors have recognized that primarily the absorption and emission properties of the red-emitting phosphor are crucial for the color quality and the efficiency. Therefore, the other phosphors need not necessarily be quantum dot phosphors. In a non-limiting embodiment, the first phosphor comprises no Hg and/or Cd and thus contributes to fulfilling the regulations of the RoHS.

In accordance with at least one embodiment, the phosphor mixture accords with the RoHS Directive mentioned above.

In accordance with at least one embodiment, the first phosphor is in the form of particles. In a non-limiting embodiment, the first phosphor comprises particles having a mean particle diameter ($d_{50}$) of 0.1 μm to 1000 μm, such as from 1 μm to 1000 μm. In a non-limiting embodiment, the first phosphor comprises particles having a mean particle diameter ($d_{50}$) of 1 μm to 50 μm, for example of 5 μm to 50 μm.

In accordance with at least one embodiment, the first phosphor is a green phosphor containing a beta-SiAlON or consisting of a beta-SiAlON. The beta-SiAlON can conform to the following chemical formula, for example: $Si_{6-z}Al_zO_zN_{8-z}$:RE, wherein it holds true that: $0<z\leq6$, and $0.001\leq y\leq 0.2$ and RE is one or more elements selected from rare earth metals, such as at least Eu and/or Yb.

Furthermore, it is also possible for the first phosphor to be a green phosphor which has the formula $Y_3(Al_{1-x}Ga_x)_5O_{12}$:Ce or consists of this material, wherein the proportion of Ga is $0.2\leq x\leq 0.6$, such as $0.3\leq x\leq 0.5$, or $0.35\leq x\leq 0.45$.

Moreover, the first phosphor can be a green phosphor which comprises $(Gd,Y)_3(Al_{1-x}Ga_x)_5O_{12}$:Ce, or $(Tb,Y)_3(Al_{1-x}Ga_x)_5O_{12}$:Ce or consists of one of these materials, having a cerium proportion of 1.5 mol % to 5 mol %, such as 2.5 mol % to 5 mol %, and a gallium proportion x of 0 to 0.5, from x of 0 to 0.1

Furthermore, it is also possible for the first phosphor to comprise $Lu_3(Al_{1-x}Ga_x)_5O_{12}$:Ce or $(Lu,Y)_3(Al_{1-x}Ga_x)_5O_{12}$:Ce or to consist of one of these materials, having a cerium proportion of 0.5 mol % to 5 mol %, such as 0.5 mol % to 2 mol %, in each case relative to the rare earth metals, and a gallium proportion x of between 0 and 0.5, for example between 0.15 and 0.3.

In accordance with at least one embodiment of the phosphor combination, the red-emitting quantum dot phosphor has a mean particle diameter ($d_{50}$) of 1 nm to 300 nm, such as 1 nm to 100 nm, for example from 1 nm to 30 nm, and or from 2 nm to 50 nm, for example of 2 nm to 20 nm. Nanoparticles of this order of magnitude have a well-defined band gap and are distinguished by a particularly well-defined absorption and emission behavior. In this case, the emission wavelength results from the band gap of the semiconductor material and the quantization by the respective size of the quantum dot phosphor.

In accordance with at least one embodiment, the particle shape of the quantum dot phosphor is spherical. However, the particle shape can in principle also be elongate, that is to say deviate from an ideal spherical shape.

In accordance with at least one embodiment, the red-emitting quantum dot phosphor of the phosphor combination contains at least one of the semiconductor materials selected from the group of the following semiconductor materials: CdS, CdSe, CdTe, ZnS, ZnSe, ZnTe, HgTe, HgSe, GaP, GaAs, GaSb, AlP, AlAs, AlSb, InP, InAs, InSb, SiC, InN, AlN, and also the solid solutions thereof or combinations thereof. Besides binary solid solutions, ternary and quaternary solid solutions are also conceivable. By way of example, the quantum dot phosphor can contain or consist of exactly one, exactly two, exactly three or exactly four of the semiconductor materials mentioned.

In accordance with at least one other embodiment, the quantum dot phosphor comprises a material having a perovskite structure.

In contrast to typical, conventional red phosphors which are not quantum dot phosphors, such as e.g. $Eu^{2+}$-doped nitrides, such as, for instance, $CaAlSiN_3$:$Eu^{2+}$, $(Ba,Sr)_2Si_5N_8$:$Eu^{2+}$, or $Eu^{2+}$-doped sulfides, quantum dot phosphors have a significantly smaller emission full width at half maximum.

In accordance with at least one embodiment, the quantum dot phosphor has a core-shell structure. In a non-limiting embodiment, in this case, core and shell comprise mutually different semiconductor materials. In this way, absorption and emission can be spectrally separated from one another. By way of example, the absorption can be effected predominantly or exclusively by the shell, while the emission is effected predominantly or exclusively by the core. This is possible on the basis of different band gaps of the semiconductor materials chosen for the core and the shell.

In at least one embodiment, the core comprises or consists of CdSe and the shell comprises or consists of CdS.

In accordance with at least one embodiment, the quantum dot phosphor has a so-called "alloy structure". This is taken to mean quantum dot phosphors which indeed have a composition in the interior or core which is different than that at their surface or shell. In contrast to a conventional core-shell structure, however, they do not have a sharp boundary between core and shell; rather, the transitions are fluid. In other words, the quantum dot phosphor comprises at least two semiconductor materials, for instance at least two of the semiconductor materials listed above, and the quantum dot phosphor additionally has a gradient in the composition of said at least two semiconductor materials from the interior to the exterior.

In accordance with at least one embodiment of the phosphor combination, the red-emitting quantum dot phosphor comprises a core having a mean diameter of 1 to 100 nm, such as from 2 to 10 nm, and a shell having a mean thickness of up to 200 nm, for example up to 20 nm, for example between 1 and 200 nm or between 1 and 20 nm, such as 1 to 10 nm, for instance. By way of example, the thickness of the shell is between 2 and 20 nm, such as 5 to 20 nm, for instance. The shell enables a particularly tailored and targeted absorption. An excessively thin shell results in a reduction of the absorption advantages.

In accordance with at least one embodiment of the phosphor combination, the quantum dot phosphor has an SiO encapsulation. That means that in each case one or more quantum dots of the phosphor are surrounded by an encapsulation comprising or consisting of SiO. By way of example, the quantum dot phosphor has a core-shell structure and additionally an SiO encapsulation. In this case, the quantum dot phosphor thus has a plurality of shells besides the core, wherein the first shell comprises a semiconductor material, while the further shell can be an SiO shell and thus forms an SiO encapsulation. The SiO encapsulation is suitable for reducing or preventing an agglomeration of the quantum dot phosphors and for protecting the quantum dot phosphors e.g. against oxygen or water.

In accordance with at least one development, the SiO encapsulation has a diameter of 1 μm to 20 μm.

In accordance with at least one embodiment, the proportion of the red-emitting quantum dot phosphor relative to the total amount of phosphor is less than 60% by weight, such as less than 30% by weight, for example less than 20% by weight, alternatively less than 10% by weight, or less than 5% by weight or even less than 2% by weight. By way of example, the proportion of the quantum dot phosphor relative to the total amount of phosphor in the phosphor combination is between 0.1 and 60% by weight, 0.1 and 30% by weight, 0.1 and 20% by weight or 0.1 and 10% by weight, for example between 0.1 and 5% by weight, such as 1 to 2% by weight, for instance.

In accordance with a non-limiting embodiment, the phosphor combination comprises a third phosphor, wherein the third phosphor has the formula $$(MB)(TA)_{3-2x}(TC)_{1+2x}O_{4-4x}N_{4x}{:}E$$

TA is selected from a group of monovalent metals. In particular, TA is selected from a group comprising the monovalent metals lithium, sodium, copper, silver and combinations thereof. In a non-limiting aspect, TA is lithium.

MB is selected from a group of divalent metals. In particular, MB is selected from a group comprising the divalent metals magnesium, calcium, strontium, barium, zinc and combinations thereof. For example, MB is calcium, strontium, barium or a combination thereof. In a non-limiting aspect, MB is strontium.

TC is selected from a group of trivalent metals. In particular, TC is selected from a group comprising the trivalent metals boron, aluminum, gallium, indium, yttrium, iron, chromium, scandium, rare earth metals and combinations thereof. In a non-limiting aspect, TC is aluminum.

E is selected from a group comprising europium, manganese, cerium, ytterbium and combinations thereof. In a non-limiting aspect, E is $Eu^{3+}$, $Eu^{2+}$, $Ce^{3+}$, $Yb^{3+}$, $Yb^{2+}$ and/or $Mn^{4+}$. For example, E is $Eu^{2+}$.

It holds true that $0<x<0.875$. In a non-limiting aspect, it holds true that: $0.45<x<0.55$. For example, it holds true that: $x=0.5$.

The inventors have recognized that a phosphor combination comprising a first phosphor, a second phosphor, which is a red-emitting quantum dot phosphor, and a third phosphor, having the general formula $(MB)(TA)_{3-2x}(TC)_{1+2x}O_{4-4x}N_{4x}{:}E$, combines a particularly good color quality with a high efficiency and thus affords a spectral advantage in the case of use in an optoelectronic device. In addition, such a phosphor combination is more environmentally friendly than a phosphor combination comprising a quantum dot phosphor as sole red-emitting phosphor. The use of a third phosphor having the general formula $(MB)(TA)_{3-2x}(TC)_{1+2x}O_{4-4x}N_{4x}{:}E$ makes it possible, with the color locus remaining the same and with the light quality remaining the same, to use quantum dot phosphor comprising Hg and/or Cd to a lesser extent, which makes it possible to achieve the effect that the phosphor combination satisfies the requirements of the RoHS regulation.

The use of $(MB)(TA)_{3-2x}(TC)_{1+2x}O_{4-4x}N_{4x}{:}E$ as third phosphor additionally has the advantage that this red-emitting phosphor has a more narrowband emission than conventional red-emitting phosphors. This is positive for the color rendering and the spectral efficiency.

Overall, the described phosphor combination comprising a third phosphor of the type described here results in a reduction of the double conversion and scattering. This makes it possible to reduce the total amount of the phosphors in the phosphor combination. This reduction enables a further reduction of the scattering. Consequently, the use of phosphor combinations of this type in an optoelectronic device allows a significant increase in the total electrical efficiency.

In accordance with at least one embodiment, the third phosphor has the formula $$(MB)Li_{3-2x}Al_{1+2x}O_{4-4x}N_{4x}{:}E.$$

MB is selected from a group of divalent metals. In particular, MB is selected from a group comprising magnesium, calcium, strontium, barium, zinc and combinations thereof. In a non-limiting aspect, MB is calcium, strontium, barium or a combination thereof. In particular, MB is strontium. E is selected from a group comprising europium, manganese, cerium, ytterbium and combinations thereof. In particular, E is $Eu^{3+}$, $Eu^{2+}$, $Ce^{3+}$, $Yb^{3+}$, $Yb^{2+}$ and/or $Mn^{4+}$. It holds true that $0<x<0.875$. In particular, it holds true that $0.45<x<0.55$. For example, $x=0.5$.

Here and throughout the application, phosphors are described on the basis of molecular formulae. In the case of the molecular formulae specified, it is possible for the phosphor to comprise further elements, for instance in the form of impurities, wherein said impurities taken together have at most a proportion by weight in the phosphor of 1% or 100 μm (parts per million) or 10 ppm.

By using the activators Eu, Ce, Yb and/or Mn, in particular Eu or Eu in combination with Ce, Yb and/or Mn, it is possible to set the color locus of the third phosphor in the CIE color space, the peak wavelength λpeak or dominant wavelength λdom thereof and the full width at half maximum particularly well.

In accordance with a further embodiment, the activator E can be present in mol % amounts of 0.1 mol % to 20 mol %, 1 mol % to 10 mol %, 0.5 mol % to 5 mol %. Excessively high concentrations of E can result in a loss of efficiency owing to concentration quenching. Here and hereinafter, mol % indications for the activator E, in particular Eu, are understood in particular as mol % indications relative to the molar proportion of MB in the third phosphor.

In accordance with a further embodiment, MB can be present in mol % amounts of 80 mol % to 99.9 mol %.

In accordance with at least one embodiment, the third phosphor crystallizes in the tetragonal space group $P4_2/m$. Phosphors which crystallize in this space group have a particularly narrowband emission.

In accordance with at least one embodiment, $x=0.5$. The third phosphor having the formula $(MB)Li_2Al_2O_2N_2{:}E$ results, wherein MB is selected from a group of divalent metals comprising magnesium, calcium, strontium, barium, zinc or combinations thereof, wherein E is selected from a group comprising europium, manganese, cerium, ytterbium and combinations thereof.

In a non-limiting aspect, the third phosphor is $SrLi_2Al_2O_2N_2{:}Eu$. The third phosphor is thus a europium-doped lithium oxonitridoaluminate phosphor. This phosphor has a particularly narrowband emission. The advantages mentioned are particularly noticeable for this phosphor as third phosphor.

In accordance with at least one embodiment, the third phosphor emits electromagnetic radiation from the red spectral range. In particular, the phosphor emits radiation having a dominant wavelength of between 590 nm and 620 nm inclusive, such as between 595 nm and 615 nm inclusive, or between 600 nm and 610 nm inclusive.

By way of example, upon excitation with a primary radiation having a wavelength of e.g. 460 nm, the phosphor of the formula $SrLi_2Al_2O_2N_2{:}Eu$ emits in the red spectral range of the electromagnetic spectrum and exhibits a narrowband emission, that is to say an emission having a small full width at half maximum, such as having a full width at half maximum of less than 55 nm.

In accordance with at least one embodiment, the third phosphor has an emission spectrum having a maximum peak wavelength of 614 nm+/−10 nm, 9 nm, 8 nm, 7 nm, 6 nm, 5 nm, 4 nm, 3 nm, 2 nm or 1 nm and/or a full width at half maximum of less than 70 nm, less than 65 nm or less than 60 nm, in particular less than 55 nm, such as less than 50 nm, for example 48 nm.

In accordance with at least one embodiment, the full width at half maximum is less than 55 nm, such as less than 50 nm, for example less than or equal to 45 nm.

In accordance with at least one embodiment, the third phosphor does not crystallize in the space group I4/m or the crystal structure of the $UCr_4C_4$ type.

In accordance with an embodiment which is different than that, the third phosphor crystallizes in the space group I4/m or the crystal structure of the $UCr_4C_4$ type.

In accordance with at least one embodiment, the third phosphor is able to be excited with a primary radiation from the UV and/or blue spectral range. By way of example, the phosphor is able to be excited with a wavelength of 430 to 470 nm, e.g. 460 nm+/−10%.

In accordance with one embodiment, the proportion of the third phosphor relative to the total amount of phosphor is less than 60% by weight, such as less than 30% by weight, for example less than 20% by weight, or less than 10% by weight. By way of example, the proportion of the third phosphor relative to the total amount of phosphor in the phosphor combination is between 0.1 and 60% by weight, 0.1 and 30% by weight, 0.1 and 20% by weight or 0.1 and 10% by weight.

In accordance with at least one embodiment, the proportion of the third phosphor relative to the total amount of phosphor in the phosphor combination is at least 10 percent by weight, such as at least 20 percent by weight.

In accordance with one embodiment, the phosphor combination comprises at least one further phosphor, the latter being a phosphor different than the first, second and third phosphors.

In accordance with one embodiment, the further phosphor is a phosphor of the general formula:

$$M_{(1-x-y-z)}Z_z[A_aB_bC_cD_dE_eN_{4-n}O_n]:ES_xRE_y,$$

M here is selected from the group of the elements Ca, Sr, Ba.

Z here is selected from the group of the elements Na, K, Rb, Cs, Ag.

A here is selected from the group of the elements Mg, Mn, Zn.

B here is selected from the group of the elements B, Al, Ga.

C here is selected from the group of the elements Si, Ge, Ti, Zr, Hf.

D here is selected from the group of the elements Li and Cu.

E here is selected from the group of the elements P, V, Nb, Ta.

ES here is $Ce^{3+}$.

RE here is selected from the group consisting of $Eu^{2+}$, $Eu^{3+}$, $Yb^{2+}$, $Yb^{3+}$.

It holds true here that:
$0 \leq x \leq 0.2$
$0 \leq x \leq 0.2$
$0 \leq x+y \leq 0.4$
$0 \leq z < 1$, and in a non-limiting aspect, it holds true that: $z \leq 0.9$, e.g. it holds true that $z \leq 0.5$
$0 \leq n \leq 0.5$
$0 \leq a \leq 4$, e.g. it holds true that $2 \leq a \leq 3$
$0 \leq b \leq 4$
$0 \leq c \leq 4$
$0 \leq d \leq 4$
$0 \leq e \leq 4$
$a+b+c+d+e=4$
$2a+3b+4c+d+5e=10-y-n+z$ In a non-limiting aspect, it holds true that: $x+y+z \leq 0.2$.

In one embodiment, the further phosphor is selected from the list of the following phosphors:

$Ce^{3+}$ garnets, for example:
$Y_3(Al_{1-x}Ga_x)_5O_{12}:Ce^{3+}$,
$(Gd,Y)_3(Al_{1-x}Ga_x)_5O_{12}:Ce^{3+}$,
$(Tb,Y)_3(Al_{1-x}Ga_x)_5O_{12}:Ce^{3+}$,
$Lu_3(Al_{1-x}Ga_x)_5O_{12}:Ce^{3+}$,
$(Lu,Y)_3(Al_{1-x}Ga_x)_5O_{12}:Ce^{3+}$, $Ce^{3+}$ doped (oxy)nitrides, for example:
$(La,Y)_3Si_6N_{11}:Ce^{3+}$,
$(La_{1-x},Ca_x)_3Si_6(N_{1-y}O_y)_{11}:Ce^{3+}$,
where $0 \leq x \leq 1$ and $0 \leq y \leq 1$—$Eu^{2+}$ oxide (oxy)nitrides, for example:
$(Ca,Sr)AlSiN_3:Eu^{2+}$,
$Sr(Sr,Ca)Si_2Al_2N_6:Eu^{2+}$,
$(Ca,Ba,Sr)_2Si_5N_8:Eu^{2+}$,
$SrAlSi_7N_4:Eu^{2+}$,
$Sr[Al_3LiN4]:Eu^{2+}$,
$Ca[Al_3LiN4]:Eu^{2+}$,
$Ca_8Mg(SiO_4)_4Cl_{12}:Eu^{2+}$, $Eu^{2+}$ doped sulfides, for example:
$CaS:Eu^{2+}$,
$SrGa_2S_4:Ce^{2+}$, $Mn^{4+}$ doped phosphors, wherein for example $K_2SiF_6$, $Na_2SiF_6$, $K_2TiF_6$ can serve as host structure.

As $Mn^{4+}$ doped phosphors, generally it is possible to use fluoridic and oxyfluoridic phosphors, for instance phosphors of the general formula:

$$EA_xA_y[B_zC_fD_gE_hO_aFb]:Mn^{4+}_c$$

wherein A is selected from the group consisting of Li, Na, K, Rb, Cs, Cu, Ag, $NH_4$ or combinations thereof, wherein EA is selected from the group of the elements consisting of Be, Mg, Ca, Ba, Sr, Zn or combinations thereof, wherein B is selected from the group of the elements consisting of Si, Ge, Sn, Ti, Zr, Hf, wherein C is selected from the group of the elements consisting of Al, Ga, In, Gd, Y, Sc, La, Bi, Cr, wherein D is selected from the group of the elements consisting of Nb, Ta, V, wherein E is selected from the group of the elements consisting of W, Mo or combinations thereof.

In this case, the partial charge d from $[EA_xA_y]^d$ results from $(2*x+y)$ and corresponds to the inverse of the partial charge e of $[[B_zC_fD_gE_hO_aF_b]:Mn^{4+}_c]^e$, which is also constituted from $(4*z+3*f+5*g+6*h+4*c-2*a-b)$.

$Mg_4GeO_{3.5}F$ can likewise be used as a host structure, wherein the activator content is ≤3 at. %, such as ≤1 at. %. The further phosphor can have the general formula $(4-x)$ $MgO*xMgF_2*GeO_2:Mn^{4+}$.

$Mn^{4+}$ doped $A_2Ge_4O_9$ or $A_3A'Ge_8O_{18}$, wherein A and A' are selected in each case independently of one another from the group of the elements Li, K, Na, Rb, can likewise serve as further phosphor, for example $Mn^{4+}$ doped $K_2Ge_4O_9$, $Rb_2Ge_4O_9$ or $Li_3RbGe_8O_{18}$.

$Mn^{4+}$ doped $Sr_4Al_{14}O_{25}$, $Mg_2TiO_4$, $CaZrO_3$, $Gd_3Ga_5O_{12}$, $Al_2O_3$, $GdAlO_3$, $LaAlO_3$, $LiAl_5O_8$, $SrTiO_3$, $Y_2Ti_2O_7$, $Y_2Sn_2O_7$, $CaAl_{12}O_{19}$, MgO, $Ba_2LaNbO_6$ can likewise be used as further phosphor.

Moreover, phosphors from the class of (nanoparticulate) semiconductor materials can serve as further phosphor, for example phosphors of the general composition $ZMX_3$,
wherein Z is selected from the group consisting of Cs, $CH_3NH_3$, $CH(NH_2)_2$, $(CH_3)_3NH$,
wherein M is selected from the group consisting of Pb, Sn, Ge, Mn, Cd, Zn,
wherein X is selected from the group consisting of Br, I, SCN.

Moreover, phosphors of the general formula $A^I_2M^IM^{III}X_6$ can serve as further phosphor,
wherein $A^I$ is selected from the group consisting of Cs, $CH_3NH_3$, $CH(NH_2)_2$, $(CH_3)_3NH$,
wherein $M^I$ is selected from the group consisting of Ag, K, Tl, Au,
wherein $M^{III}$ is selected from the group consisting of Sb, Bi, As, Sn,
wherein X is selected from the group consisting of Br, I, SCN.
For example phosphors of the formulae $Cs_3Sb_2I_9$, $(CH_3NH_3)_3Sb_2I_9$, $Cs_2SnI_6$.

In accordance with a second aspect, a conversion element may include a phosphor combination in accordance with the first aspect.

In accordance with at least one embodiment, the conversion element comprises at least one layer. The phosphor combination is present in the layer.

In accordance with at least one embodiment, the conversion element comprises at least one second layer and/or third layer besides the first layer. By way of example, the second layer can be arranged on the first layer. The third layer can be arranged on the second layer. The phosphors of the phosphor combination can be distributed among the individual layers. By way of example, each phosphor can be present in a dedicated layer.

In accordance with at least one embodiment, the conversion element comprises at least one matrix material. By way of example, the phosphors are embedded into the matrix material or distributed therein. In particular, the phosphors can be distributed as particles uniformly in the matrix material.

According to a third aspect, an optoelectronic device may include:
a radiation-emitting semiconductor chip, which emits electromagnetic radiation in a first wavelength range,
a phosphor combination in accordance with the first aspect.

Optoelectronic devices are distinguished by a particularly good color rendering and efficiency.

The semiconductor chip can be in particular a semiconductor chip which emits UV radiation and/or blue light. In a non-limiting aspect, the semiconductor chip emits light from the blue range of the spectrum. In a non-limiting embodiment, the semiconductor chip emits light having a peak wavelength of between 430 nm and 470 nm.

In accordance with at least one embodiment, the phosphor combination is arranged in the beam path of the semiconductor chip. By way of example, the phosphor combination is arranged on a main beam exit surface of the semiconductor chip.

In accordance with at least one embodiment, the phosphor combination is present in a conversion element arranged on the semiconductor chip. In accordance with at least one embodiment, the phosphor combination is arranged as potting over the semiconductor chip.

In accordance with at least one embodiment, the optoelectronic device is a light-emitting diode (LED), such as an LED which emits white light.

BRIEF DESCRIPTION OF THE DRAWINGS

In the following, the phosphor combination described herein is explained in more detail in conjunction with non-limiting embodiments and the associated figures.

Elements which are identical, of identical type or act identically are provided with the same reference signs in the figures. The figures and the size relationships of the elements illustrated in the figures among one another should not be regarded as to scale. Rather, individual elements may be illustrated with an exaggerated size in order to enable better illustration and/or in order to afford a better understanding.

FIG. 1A shows a schematic side view of a phosphor combination 10, comprising a first phosphor 1 and a second phosphor 2, which is a red-emitting quantum dot phosphor. In a non-limiting aspect, a third phosphor 3 is additionally present, for example the red-emitting phosphor $SrLi_2Al_2O_2N_2$:Eu. As illustrated in FIG. 1A, the phosphor combination 10 is a phosphor mixture 10.

FIG. 1B shows a schematic side view of a phosphor combination 10, the phosphors not being mixed together in the case of FIG. 1B. Although the phosphor combination is a phosphor mixture, it is also possible for the phosphors to be present in a manner not mixed together.

FIG. 2 shows a schematic side view of a conversion element 20, which conversion element comprises the phosphor combination 10. In non-limiting aspect, the conversion element comprises the phosphor combination as a phosphor mixture. The conversion element can comprise a matrix material 4, into which the phosphors are embedded.

FIG. 3B shows an optoelectronic device 30 comprising a semiconductor chip 50 and a potting 40. The potting material, which can be e.g. a silicone or a resin, contains the phosphor combination. The optoelectronic devices can additionally comprise a housing 60.

By contrast, FIG. 6B shows a third phosphor, which likewise emits red (R), but is not a quantum dot phosphor. In this way, only a limited amount of the quantum dot phosphor (R QD) is required, which makes it easier to fulfil the RoHS regulations, while at the same time a highly efficient optoelectronic device is obtained.

FIG. 7 explains computationally how the relative efficiency gains arise in the case of optoelectronic devices which use the phosphor combination.

FIG. 11 shows a table that summarizes the composition of the phosphor combinations. The table compares the respective phosphor combinations with regard to the color coordinates Cx, Cy, the color temperature (CCT), the color rendering index (CRI value), the R9 value (reference color 9, red rendering), and also the spectral efficiency (LER). It is clearly evident from the simulations that all phosphor combinations comprising a first green-emitting LuAGaG:$Ce^{3+}$ phosphor and a red-emitting quantum dot phosphor as second phosphor combine a particularly high spectral efficiency (LER) with particularly good color rendering properties (examples 1-3). While example 1 has the best efficiency, example 2 represents the best combination of efficiency and environmental acceptability. Although example 1 exhibits the best efficiency, it does not accord with the RoHS regulations. On account of the presence of $Sr[Al_2Li_2O_2N_2]:Eu^{2+}$ as third phosphor, example 2 makes it possible to fulfil the RoHS regulations with at the same time excellent color rendering and efficiency properties.

DETAILED DESCRIPTION

Figure 3A:
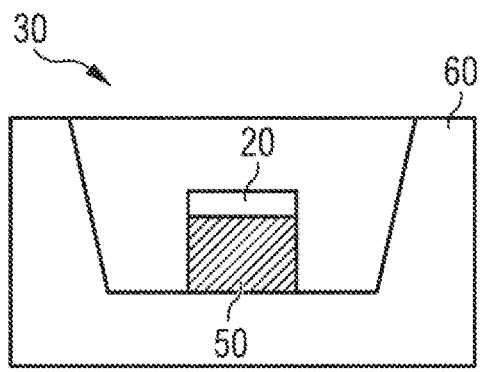
FIGS. 3A and 3B show in each case a schematic side view of embodiments of optoelectronic devices 30. They each comprise a semiconductor chip 50, in the beam path of which the phosphor combination is situated. In the case of FIG. 3A, a conversion element 20 comprising the phosphor combination is arranged on the semiconductor chip.
Figure 3B:
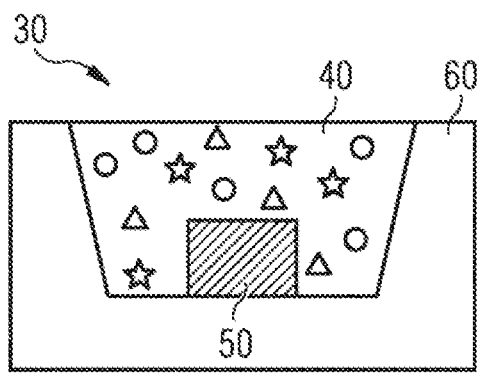
Figure 4:
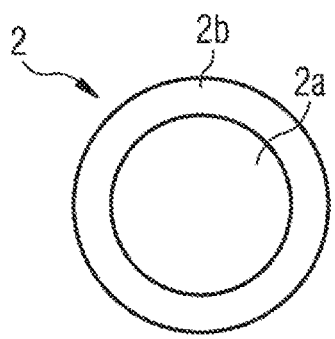
FIG. 4 schematically shows an exemplary construction of the second phosphor. In one non-limiting embodiment of the phosphor combination, the quantum dot phosphor can have a core-shell structure comprising a core 2a and a shell 2b. For example, the core 2a contains or consists of CdSe and the shell 2b contains or consists of CdS.
Figure 5A:
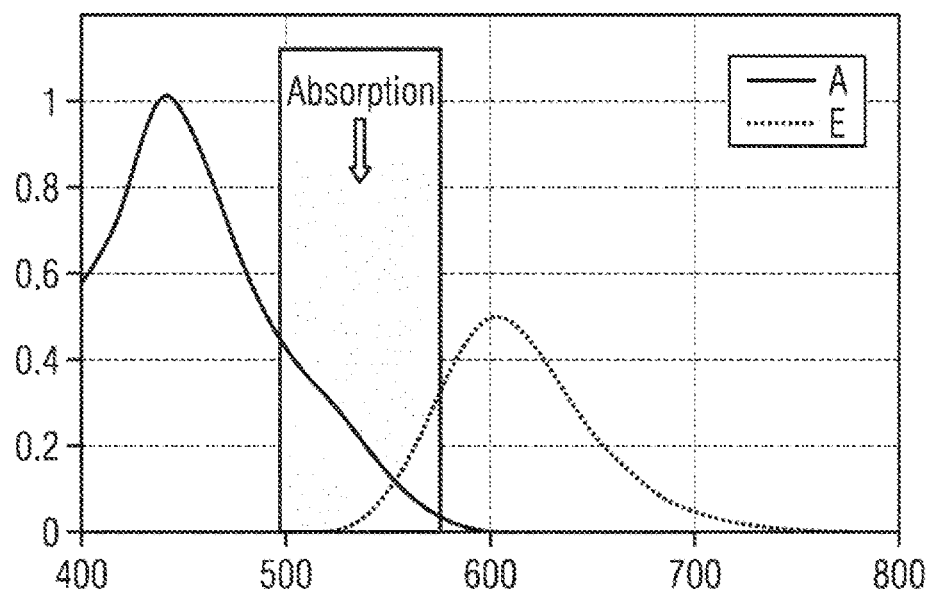
FIG. 5A shows the absorption properties (A) and emission properties (E) of a conventional red-emitting phosphor. The absorption ranges from the blue range of the spectrum through to the phosphor's inherent red emission. The inventors have recognized that such wide absorption results in the efficiency losses to a considerable extent.
Figure 5B:
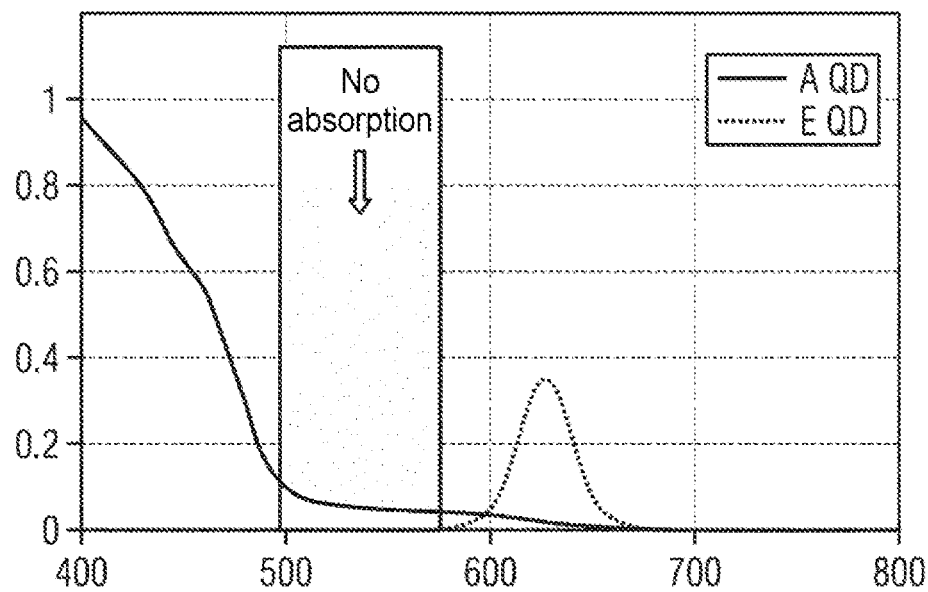
FIG. 5B shows the absorption properties (A) and emission properties (E) of a red-emitting quantum dot phosphor (QD). Quantum dot phosphors absorb almost exclusively in the desired blue range of the spectrum. The absorption and emission ranges are thus separate from one another. Undesired double conversion can thus largely be avoided.
Figure 6A:
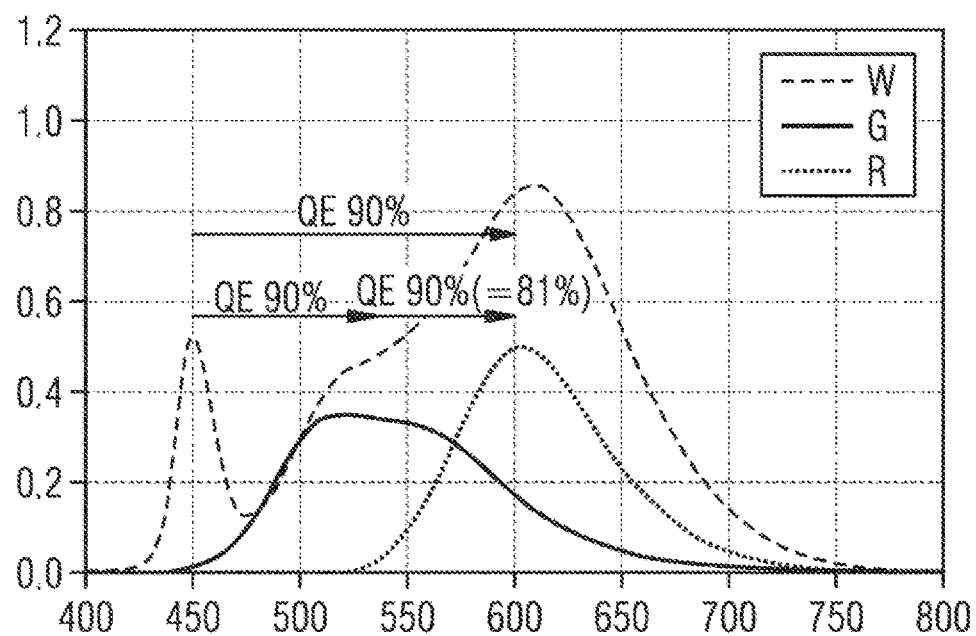
FIG. 6A shows the emission spectrum of a light-emitting diode comprising a blue semiconductor chip and a conventional phosphor combination. The blue semiconductor chip emits blue light. The blue light is partly absorbed by a first phosphor and emitted as green light (G). The blue light is furthermore partly absorbed by a second phosphor and emitted as red light (R). Furthermore, part of the green light is likewise absorbed by the second phosphor and emitted into red light (R). An undesired two-stage conversion (or double conversion) is involved here. Since the quantum efficiency (QE) is approximately 90% for each of the conversion steps, the quantum efficiency in the case of a double conversion is in total only 90%*90%=81%. The double conversion thus results in losses for the quantum efficiency. Moreover, a considerable part of the first, green-emitting phosphor contributes only to the production of red light, but not to the generation of green light. This proportion of the first phosphor acting as "sacrificial phosphor" is thus dispensable for the desired spectrum. However, its presence results in additional scattering losses. The white spectrum (W) emitted overall is thus obtained only with considerable losses concerning the total electrical efficiency.
Figure 6B:
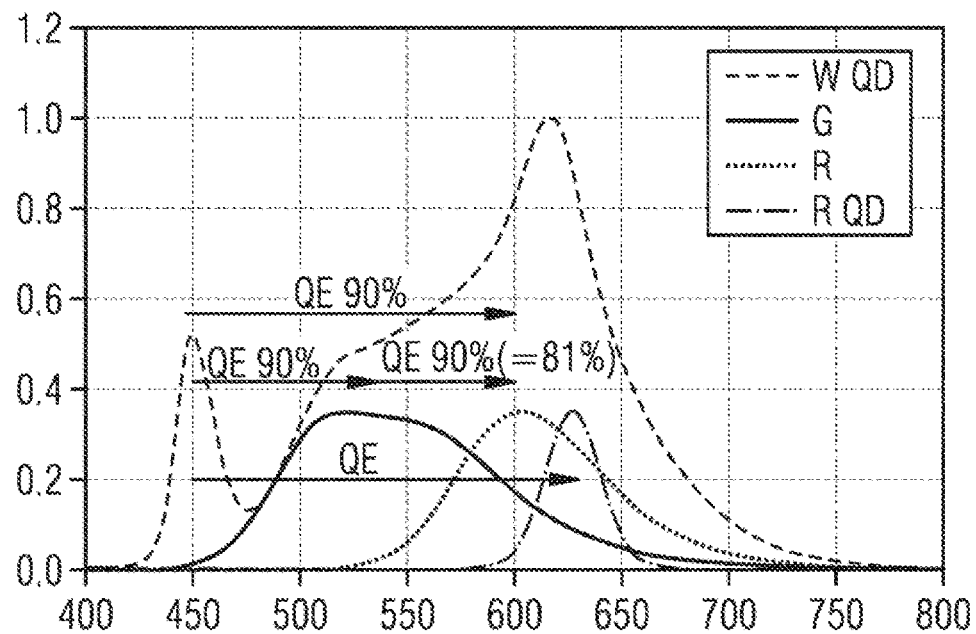
FIG. 6B shows the emission spectrum (W QD) of a light-emitting diode comprising a phosphor combination. Here, too, the blue light from the semiconductor chip is absorbed by a conventional green phosphor. However, since the second phosphor is not a conventional red-emitting phosphor having wide absorption, but rather a red-emitting quantum dot phosphor (R QD) having narrow absorption, double conversion hardly takes place. Undesired losses for the quantum efficiency (QE) owing to double conversion can thus be significantly reduced. Moreover, an in some instances considerable amount of the first, green phosphor can be saved since less green phosphor (G) acts as sacrificial phosphor. The saving in some instances can be more than 30%, e.g. 35%. Consequently, scattering no longer takes place at this saved amount of first phosphor. Moreover, the quantum dots of the second phosphor also effect hardly any scattering. In total, therefore, the scattering that takes place is also significantly less than in the case of conventional phosphor combinations. The phosphor combination can optionally also contain a third phosphor as well.
Figures 8A, 8B:
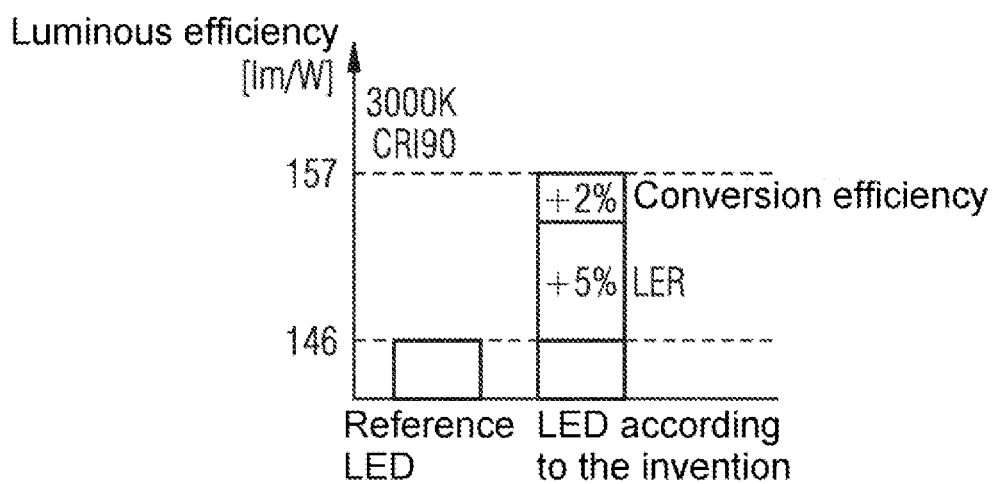
FIG. 8A summarizes measurement results on an LED and a reference LED and demonstrates the extent to which gains in the luminous efficiency are attributable to the improved conversion efficiency and to the improved spectral efficiency.
FIG. 8B explains what phosphor combinations are used of the LEDs used in the measurements in FIG. 8A. The reference LED comprises a conventional phosphor combination comprising two conventional red-emitting nitride phosphors besides a green-emitting garnet phosphor. By contrast, the LED contains a phosphor combination comprising 1% by weight of a red-emitting quantum dot phosphor. Thus, a part of the conventional red-emitting phosphor is replaced by a red-emitting quantum dot phosphor. Since the red emission thereof is converted directly from the blue semiconductor chip emission—rather than in part also by way of photons of the green phosphor as in the conventional case—in total significantly less of the green phosphor is required. This allows the proportion of green-emitting garnet phosphor to be reduced by 35%, which results in significantly fewer scattering losses. The percent by weight indications for the phosphors in FIG. 8B relate in each case to the sum of the total weight of the phosphors and the matrix material. The phosphor combinations additionally satisfy high standards with regard to the color quality. A color temperature of approximately 3000 K, a CRI value of more than 90 in each case and an R9 value of more than 50 in each case are achieved. The LED makes it possible to achieve these high color qualities with at the same time an increase in efficiency.
Figure 9:
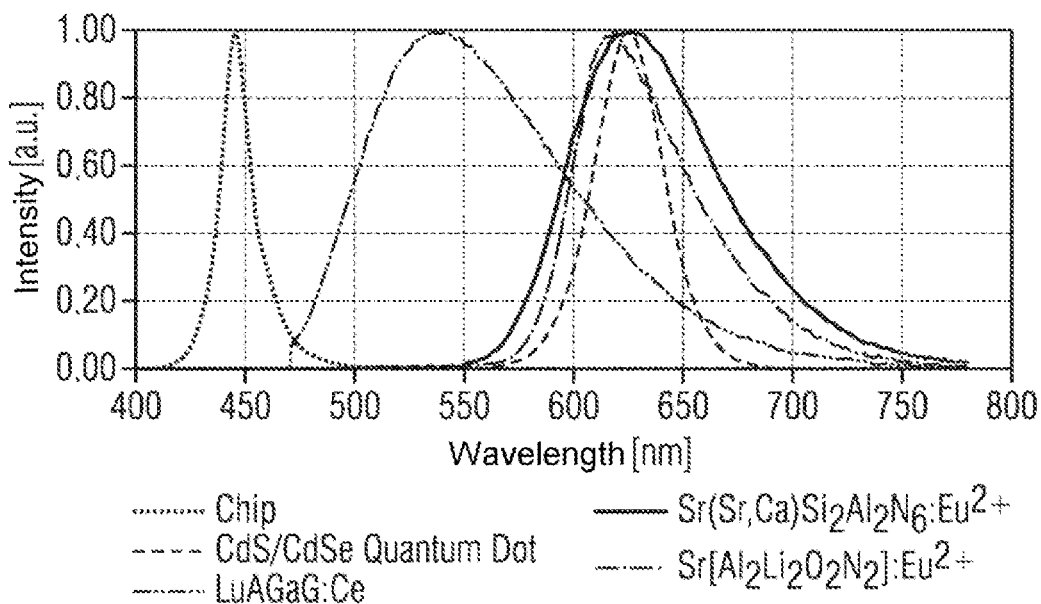
FIG. 9 shows the simulated emission spectra of a number of individual phosphors. The blue emission of a semiconductor chip is shown. Furthermore, the green emission of the LuAGaG:Ce phosphor is shown, which phosphor can be used as first phosphor of a phosphor combination. The red emission of a conventional $Sr(Sr,Ca)Si_2Al_2N_6:Eu^{2+}$ phosphor is additionally shown. Finally, the emission of an $Sr[Al_2Li_2O_2N_2]:Eu^{2+}$ phosphor exhibiting narrowband emission is shown, which phosphor can be used as third phosphor of an phosphor combination. Moreover, the particularly narrowband emission of a CdS/CdSe quantum dot phosphor is shown, which quantum dot phosphor can serve as second phosphor of a phosphor combination.
Figure 10:
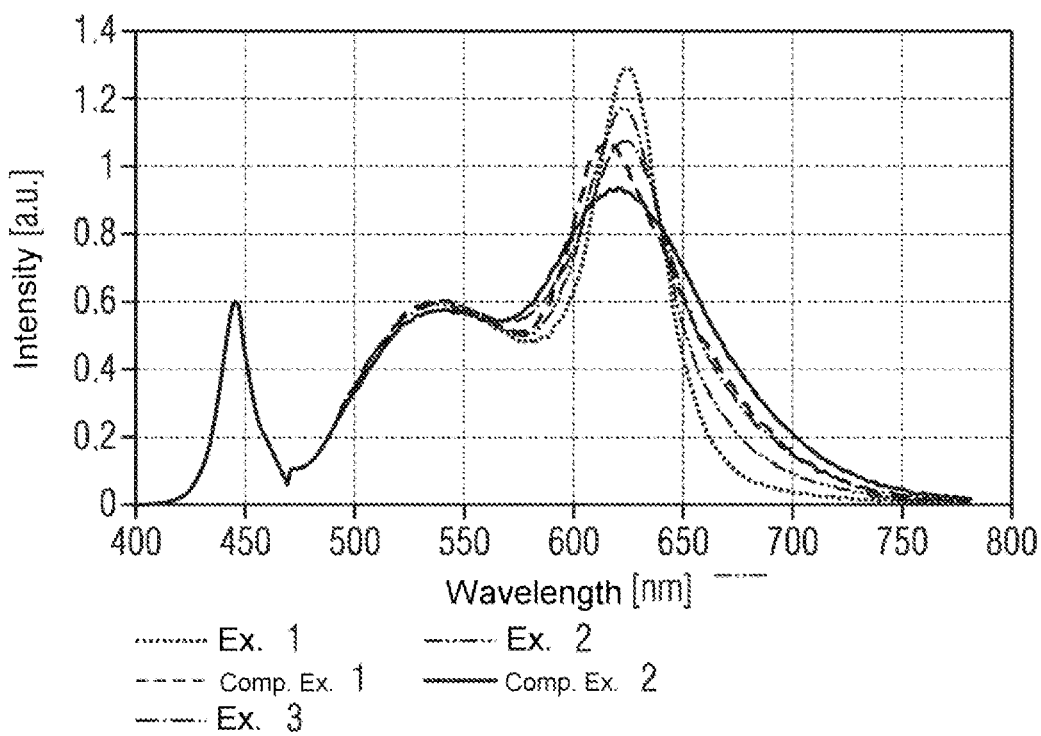
FIG. 10 shows simulations of white light LED emission spectra based on various phosphor combinations (examples 1-3 and comparative examples 1 and 2).

Exemplary embodiments can also be combined with one another, even if such combinations are not shown explicitly in the figures. Furthermore, the exemplary embodiments described in connection with the figures can have additional or alternative features in accordance with the description in the general part.

The way in which phosphor mixtures can be provided is indicated below. For producing the phosphor mixture, firstly the first and second and optionally the third phosphor are provided:

As first phosphor, consideration is given to arbitrary conventional phosphors, such as green-emitting phosphors, such as, for instance, the abovementioned phosphors $Si_{6-z}Al_zO_zN_{8-z}$:RE, $Y_3(Al_{1-x}Ga_x)_5O_{12}$:Ce, $(Gd,Y)_3(Al_{1-x}Ga_x)_5O_{12}$:Ce, $(Tb,Y)_3(Al_{1-x}Ga_x)_5O_{12}$:Ce, $Lu_3(Al_{1-x}Ga_x)_5O_{12}$:Ce or $(Lu,Y)_3(Al_{1-x}Ga_x)_5O_{12}$:Ce. The production of these phosphors is known to the person skilled in the art. Moreover, they are commercially available.

For the synthesis of red-emitting quantum dot phosphors, a large number of different syntheses are known from the prior art. Moreover, a variety of red-emitting quantum dot phosphors are commercially available.

The method for producing the third phosphor is explained below:

The third phosphor can be produced by means of solid-state reaction. To that end, the starting materials of the third phosphor can be mixed. By way of example, strontium nitride ($Sr_3N_2$), aluminum nitride (AlN), aluminum oxide ($Al_2O_3$), lithium nitride ($Li_3N$) and europium oxide ($Eu_2O_3$) can be used for producing $SrLi_2Al_2O_2N_2$:Eu. The starting materials are mixed in a corresponding ratio with one another. The starting materials can be introduced into a nickel crucible, for example. Afterward, the mixture can be heated to a temperature of between 700° C. and 1000° C., such as 800° C. In addition, the heating can take place in a forming gas flow, the temperatures being maintained for 1 to 400 hours. The proportion of hydrogen ($H_2$) in nitrogen ($N_2$) can be 7.5%, for example. The heating and cooling rates can be 250° C. per hour, for example.

As an alternative to the method described above, the third phosphor can also be produced by means of a solid-state synthesis in a welded-shut tantalum ampoule. To that end, the starting materials, such as for example in the case of the third phosphor $SrLi_2Al_2N_2O_2$:Eu, $Sr_3Al_2O_6$, Li(Flux), $LiN_3$ and $Eu_2O_3$ can be mixed in a corresponding mixture ratio with one another and can be introduced into a tantalum ampoule. By way of example, heating from room temperature to 800° C. is carried out, and the temperature is then maintained for 100 hours, for example, wherein afterward the system is cooled to room temperature again and the third phosphor has been produced. The starting materials of the third phosphor are present as powder, for example. After the heating step, a cooling process can take place, the mixture being cooled to room temperature. Room temperature is understood to mean, in particular, a temperature of 20° C. or 25° C. The synthesis is carried out at moderate temperatures and is therefore very energy-efficient. The requirements made of the furnace used, for example, are thus low. The starting materials are commercially available in a cost-effective manner and are not toxic. The phosphor mixture finally results from a combination of the abovementioned first and second phosphors and optionally the third phosphor. By way of example, powders of the phosphors can be mixed together. By way of example, the phosphors can also be introduced in each case into a matrix material and be dispersed therein. However, it is also possible to introduce each of the phosphors into a dedicated matrix material. The phosphor mixture, which should be understood to mean a combination of the phosphors, arises in this case from a combination of the different matrix materials comprising the respective phosphors.

The phosphor combination according to the invention can be obtained for example by mixing powders of the above-mentioned phosphors with or without an additional matrix material.

The invention is not restricted to the exemplary embodiments by the description on the basis of said exemplary embodiments. Rather, the invention encompasses any novel feature and also any combination of features, which in particular includes any combination of features in the patent claims, even if this feature or this combination itself is not explicitly specified in the patent claims or exemplary embodiments.

LIST OF REFERENCE SIGNS

1 First phosphor
2 Second phosphor=quantum dot phosphor
2a Core
2b Shell
3 Third phosphor
4 Matrix material
10 Phosphor combination
20 Conversion element
30 Optoelectronic device
40 Potting
50 Semiconductor chip
60 Housing
A Absorption
E Emission
QD Quantum dot phosphor ("quantum dot")
W White light
G Green phosphor
R Red phosphor
QE Quantum efficiency

The invention claimed is:

1. A phosphor combination comprising:
   a first phosphor;
   a second phosphor, wherein the second phosphor is a red-emitting quantum dot phosphor; and
   a third phosphor that is a red-emitting phosphor, wherein the third phosphor has the formula $(MB)(TA)_{3-2x}(TC)_{1+2x}O_{4-4x}N_{4x}$:E wherein:
      TA is selected from a group of monovalent metals comprising Li, Na, Cu, Ag, and combinations thereof;
      MB is selected from a group of divalent metals comprising Mg, Ca, Sr, Ba, Zn, and combinations thereof;
      TC is selected from a group of trivalent metals comprising B, Al, Ga, In, Y, Fe, Cr, Sc, rare earth metals, and combinations thereof;
      E is selected from a group comprising Eu, Mn, Ce, Yb, and combinations thereof; and
      $0<x<0.875$.

2. The phosphor combination as claimed in claim 1, further comprising a third phosphor that is a red-emitting phosphor.

3. The phosphor combination as claimed in claim 1, wherein the first phosphor is a green-emitting phosphor.

4. The phosphor combination as claimed in claim 1, wherein the first phosphor is not a quantum dot phosphor.

5. The phosphor combination as claimed in claim 1, wherein the first phosphor comprises particles having a mean particle diameter ranging from 1 μm to 1000 μm.

6. The phosphor combination as claimed in claim 1, wherein the red-emitting quantum dot phosphor having a mean particle diameter ranging from 1 nm to 300 nm.

7. The phosphor combination as claimed in claim 6, wherein the red-emitting quantum dot phosphor comprises at least one of the semiconductor materials selected from the group comprising: CdS, CdSe, CdTe, ZnS, ZnSe, ZnTe, HgTe, HgSe, GaP, GaAs, GaSb, AlP, AlAs, AlSb, InP, InAs, InSb, SiC, InN, AN, solid solutions thereof, or combinations thereof.

8. The phosphor combination as claimed in claim 1, wherein the red-emitting quantum dot phosphor has a core-shell structure.

9. The phosphor combination as claimed in claim 8, wherein the red-emitting quantum dot phosphor comprises a core having a mean diameter ranging from 1 to 200 nm.

10. The phosphor combination as claimed in claim 1, wherein the proportion of the red-emitting quantum dot phosphor relative to the total amount of phosphor in the phosphor combination comprises at most 60 percent by weight.

11. The phosphor combination as claimed in claim 1, wherein the third phosphor crystallizes in the tetragonal space group $P4_2/m$.

12. The phosphor combination as claimed in claim 1, wherein x=0.5, such that the third phosphor has the formula $(MB)Li_2Al_2O_2N_2$:E, wherein MB is selected from a group of divalent metals comprising Mg, Ca, Sr, Ba, Zn, or combinations thereof, and wherein E is selected from a group comprising Eu, Mn, Ce, Yb, and combinations thereof.

13. The phosphor combination as claimed in claim 1, wherein the third phosphor has the formula $SrLi_2Al_2O_2N_2$:$Eu^{2+}$.

14. The phosphor combination as claimed in claim 1, wherein the proportion of the third phosphor relative to the total amount of phosphor in the phosphor combination is at least 10 percent by weight.

15. The phosphor combination as claimed in claim 1, further comprising at least one further phosphor.

16. The phosphor combination as claimed in claim 1, wherein $0.45<x<0.55$.

17. A conversion element comprising the phosphor combination as claimed in claim 1.

18. An optoelectronic device comprising:
a radiation-emitting semiconductor chip configured to emit electromagnetic radiation in a first wavelength range; and
the phosphor combination as claimed in claim 1.

19. The optoelectronic device as claimed in claim 18, further comprising a conversion element arranged on the radiation-emitting semiconductor chip and/or a potting situated on the radiation-emitting semiconductor chip; wherein the phosphor combination is present in the conversion element or in the potting.

* * * * *